United States Patent
Hu et al.

(10) Patent No.: US 11,271,577 B1
(45) Date of Patent: Mar. 8, 2022

(54) SUCCESSIVE-APPROXIMATION-REGISTER ANALOG-TO-DIGITAL CONVERTOR CIRCUIT

(71) Applicant: Beken Corporation, Shanghai (CN)

(72) Inventors: Desheng Hu, Shanghai (CN); Jiazhou Liu, Shanghai (CN); Cunpeng Zhang, Shanghai (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 17/248,659

(22) Filed: Feb. 2, 2021

(30) Foreign Application Priority Data

Jan. 8, 2021 (CN) .......................... 202110026195.7

(51) Int. Cl.
*H03M 1/10* (2006.01)
*H03M 1/80* (2006.01)
*H03M 1/46* (2006.01)

(52) U.S. Cl.
CPC ......... *H03M 1/1033* (2013.01); *H03M 1/804* (2013.01); *H03M 1/1009* (2013.01); *H03M 1/468* (2013.01)

(58) Field of Classification Search
CPC ............. H03M 1/1009; H03M 1/0602; H03M 1/1033; H03M 1/468; H03M 1/804
USPC .................................................. 341/120, 172
See application file for complete search history.

(56) References Cited

U.S. PATENT DOCUMENTS

| 10,044,364 | B1 * | 8/2018 | Sharif | ...................... H03M 1/38 |
| 10,312,932 | B2 * | 6/2019 | Nakamura | ............ H03M 1/007 |
| 10,454,492 | B1 * | 10/2019 | Shikata | ............... H03M 1/1095 |

* cited by examiner

*Primary Examiner* — Khai M Nguyen
(74) *Attorney, Agent, or Firm* — Schwegman Lundberg & Woessner, P.A.

(57) ABSTRACT

An ADC circuit is provided. The ADC circuit may include an array of bit capacitors; a comparator electrically connected to the bit capacitors; a NOR gate electrically connected to the comparator; an AND gate to create an asynchronous clock (ACLK) based on a digital output from the NOR and a synchronous clock (CLKin); a delay control circuit to receive the asynchronous clock and to create a delayed asynchronous clock (ACLKd); and a SAR control circuit to receive a digital output from an output end of the comparator, to receive the delayed asynchronous clock, to transmit a bit control signal (B<9:1>) to the bit capacitors, and to transmit a delay control word (DL<7:1>) to the delay control circuit. The ADC circuit can create an asynchronous comparator clock (CKcmp) with a maximum delay value (Td_max), thus leading to an improved conversion linearity and a reduced power consumption.

18 Claims, 4 Drawing Sheets

SUCCESSIVE-APPROXIMATION-REGISTER ANALOG-TO-DIGITAL CONVERTOR CIRCUIT

CROSS REFERENCE TO RELATED APPLICATION

This application claims priority to and incorporates by reference in its entirety Chinese patent application no. 202110026195.7, filed Jan. 8, 2021.

TECHNICAL FIELD

The present application relates to an Analog-To-Digital Convertor (ADC) circuit, particularly to a Successive-Approximation-Register (SAR) ADC circuit.

BACKGROUND OF THE APPLICATION

SAR ADC circuits are widely used in electronic devices. Typically, a SAR ADC circuit may convert a continuous analog waveform into a discrete digital representation using a binary search through all possible quantization levels before finally converging upon a digital out for each conversion. However, the SAR ADC circuit with a poor clock calibration or even without any clock calibration may result in a conversion linearity deterioration and an increased power consumption.

BRIEF DESCRIPTION OF THE APPLICATION

According to an embodiment, an ADC circuit may comprise: an array of bit capacitors parallelly connected between a sampling switch and an array of bit switches; a comparator comprising an input voltage end electrically connected to the sampling switch, a reference voltage end, and a first and a second output ends; a NOR gate electrically connected to the first and the second output ends of the comparator; an AND gate configured to create an asynchronous clock based on a synchronous clock and a first digital output as a ready signal from the NOR gate; a delay control circuit configured to receive the asynchronous clock from the AND gate and to create a delayed asynchronous clock; and a SAR control circuit configured to receive a second digital output from the comparator, receive the delayed asynchronous clock from the delay control circuit, transmit a bit control signal to the bit capacitors, and transmit a delay control word to the delay control circuit, wherein the delay control circuit is configured to create an asynchronous comparator clock to control the comparator.

According to an embodiment, a delay control circuit may comprise: an array of parallel delay capacitors coupled between a first inverter and a second inverter, and coupled to a SAR control circuit, wherein the first inverter is configured to receive an asynchronous clock, wherein the second inverter is configured to output a delayed asynchronous clock to the SAR control circuit, and wherein the delay capacitors are controlled by a delay control word generated by the SAR control circuit to adjust the delayed asynchronous clock.

According to an embodiment, a method of calibrating an a SAR ADC circuit using a delay control circuit is disclosed. The delay control circuit may comprise an array of parallel delay capacitors coupled between a first inverter and a second inverter, and being coupled to a SAR control circuit, wherein the first inverter is configured to receive an asynchronous clock and the second inverter is configured to transmit a delayed asynchronous clock to the SAR control circuit, and wherein the delay capacitors are controlled by a delay control word generated by the SAR control circuit to adjust the delayed asynchronous clock. The method may comprise: receiving the asynchronous clock by the delay control circuit; receiving the delay control word from the SAR control circuit by the delay control circuit; creating the delayed asynchronous clock based on the asynchronous clock and the delay control word by the delay control circuit to transmit to the SAR control circuit; repeatedly adjusting the delayed asynchronous clock by adjusting the delay capacitors; triggering to stop calibrating the ADC circuit to determine a maximum delay value for the delayed asynchronous clock; and storing the delay control word corresponding the maximum delay value in the SAR control circuit.

BRIEF DESCRIPTION OF THE DRAWINGS

Non-limiting and non-exhaustive embodiments of the present application are described with reference to the following figures, wherein like reference numerals refer to like parts throughout the various views unless otherwise specified.

DETAILED DESCRIPTION OF THE ILLUSTRATED EMBODIMENTS

Various aspects and examples of the application will now be described. The following description provides specific details for a thorough understanding and enabling description of these examples. Those skilled in the art will understand, however, that the application may be practiced without many of these details.

Additionally, some well-known structures or functions may not be shown or described in detail, so as concise purpose and to avoid unnecessarily obscuring the relevant description.

The terminology used in the description presented below is intended to be interpreted in its broadest reasonable manner, even though it is being used in conjunction with a detailed description of certain specific examples of the application. Certain terms may even be emphasized below, however, any terminology intended to be interpreted in any restricted manner will be overtly and specifically defined as such in this Detailed Description section.

Without loss of generality, reference will be made to illustrative embodiments by taking a SAR ADC circuit and a delay control circuit as example. Those of ordinary skills in the art understand that this is only to describe the application clearly and adequately, rather than limit the scope of the application, which is defined by the appended claims.

Figure 1:
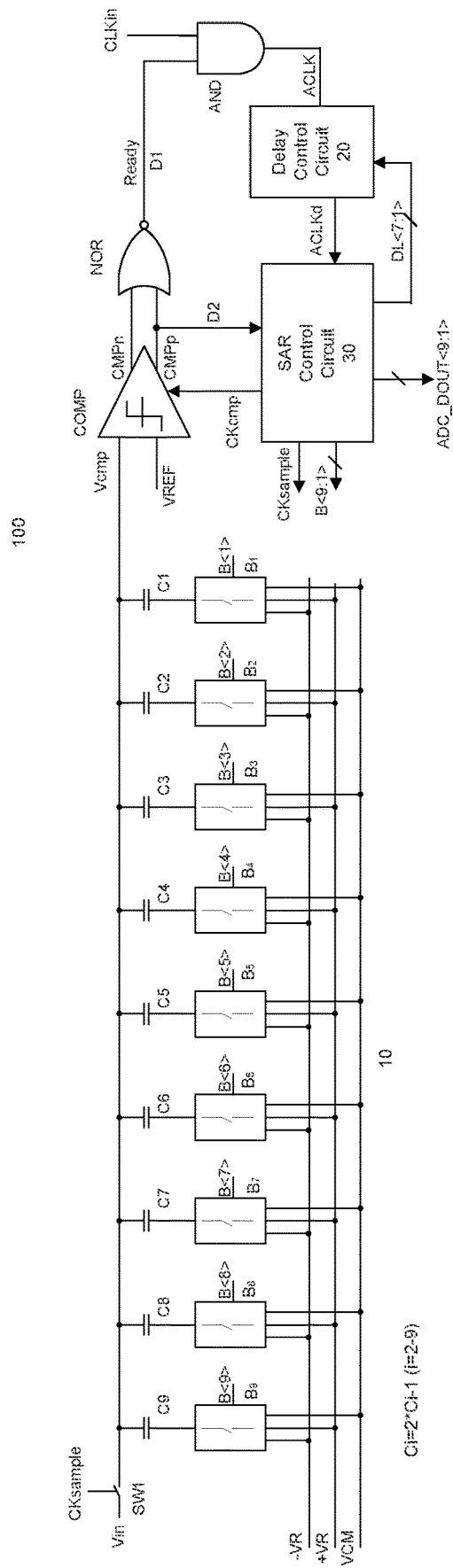
FIG. 1 is a circuit diagram illustrating a SAR ADC circuit according to an embodiment.

FIG. 1 is a circuit diagram illustrating a SAR ADC circuit 100 according to an embodiment. The SAR ADC circuit 100 may include a sampling circuit 10, a comparator (COMP), a NOR logic gate (NOR), an AND logic gate (AND), a delay control circuit 20, and a SAR control circuit 30.

The sampling circuit 10 may include an array of parallel bit capacitors ($C_1$-$C_9$) that are electrically connected between a sampling switch ($SW_1$) and an array of parallel bit switches ($B_1$—$B_9$) respectively. For example, a bit capacitor $C_3$ of the bit capacitors ($C_1$-$C_9$) is electrically connected between the sampling switch ($SW_1$) and a bit switch $B_3$ of the bit switches ($B_1$-$B_9$). The array of the bit switches ($B_1$-$B_9$) are electrically connected a bias circuit (not shown in the figures) respectively. The bias circuit can selectively provide different bias voltages, such as $-V_R$, $+V_R$, and $V_{CM}$, to the bit capacitors ($C_1$-$C_9$) via the bit switches ($B_1$-$B_9$), respectively.

The bit capacitors ($C_1$-$C_9$) of the sample circuit 10 can be binary-weighted capacitors, respectively representing a digital value such as $2^0$, $2^1$, $2^2$, $2^3$, $2^4$, $2^5$, $2^6$, $2^7$, or $2^8$. The bit capacitors ($C_1$-$C_9$) may be used to sample an analog input voltage Vin received at the sampling switch ($SW_1$) with M bits resolution. In FIG. 1, for example, M is 9, but M can be another integer equal to or greater than 3.

The comparator (COMP) includes an input voltage end ($V_{CMP}$) that is electrically connected to the sampling switch ($SW_1$) and an end of the array of the bit capacitors ($C_1$-$C_9$), a reference voltage end ($V_{REF}$), and a first and a second output ends ($D_{CMP_p}$, $D_{CMP_n}$). The comparator (COMP) may obtain an analog input voltage (Vin) from the sampling circuit 10 at an input voltage end ($V_{CMP}$), compare the input voltage (Vin) with the reference voltage ($V_{REF}$), and output two digital outputs at the first and the second output ends ($D_{CMP_p}$, $D_{CMP_n}$) to the NOR logic gate (NOR).

Figure 2:
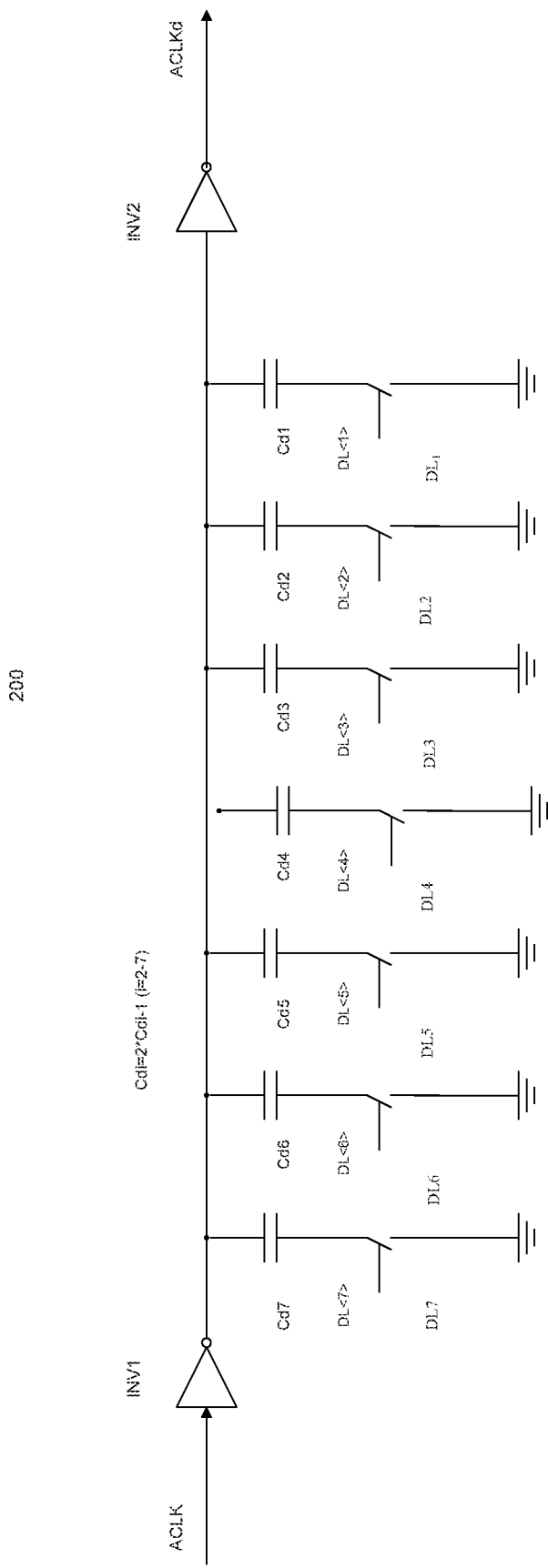
FIG. 2 is a circuit diagram illustrating a delay control circuit according to an embodiment.

The comparator (COMP) is controlled by an asynchronous comparator clock (CKcmp), which is created by the delay control circuit 20 and the SAR circuit 30 (more detailed depiction will be provided with reference to FIG. 2).

The NOR logic gate (NOR) is electrically connected to the first and the second output ends ($D_{CMP_p}$, $D_{CMP_n}$) of the comparator (COMP). The NOR logic gate (NOR) may receive the two digital outputs from the comparator (COMP) and create a first digital output ($D_1$) to send to the AND logic gate (AND). The first digital output ($D_1$) may indicate "Ready" or not (using 1 or 0) and may be sent to the AND logic gate (AND).

The AND logic gate (AND) may receive the first digital output ($D_1$) and a synchronous clock (CLKin), and may create an asynchronous clock (ACLK) based on the first digital output ($D_1$) and the synchronous clock (CLKin). The synchronous clock (CLKin) can be from an external system, for example, to synchronize the processes of the SAR ADC circuit 100. The asynchronous comparator clock (CKcmp) that is used to control the comparator (COMP) is much faster than the synchronous clock (CLKin). For example, the asynchronous comparator clock (CKcmp) can be 10 times faster than the synchronous clock (CLKin).

The delay control circuit 20 may receive the asynchronous clock (ACLK) from the AND logic gate (AND), receive a delay control word (DL<7:1>) from the SAR control circuit 30, create a delayed asynchronous clock (ACLKd), and output the delayed asynchronous clock (ACLKd) to the SAR control circuit 30. The delay control circuit 20 will be further explained with respect to FIG. 2.

The SAR circuit 30 may receive a second digital output ($D_2$) from an output (such as $D_{CMP_p}$) from the comparator (COMP), and receive the delayed asynchronous clock (ACLKd) from the delay control circuit 20. The SAR control circuit 30 may generate a bit control signal (B<9:1>) to control the array of the bit capacitors ($C_1$-$C_9$) via the array of the bit switches ($B_1$-$B_9$). The SAR control circuit 30 may also generate a delay control word (DL<7:1>) and send to the delay control circuit 20. At a conversion mode, the SAR control circuit 30 may output a converter digital output (ADC_Dout<9:1>) to an outside circuit (not shown in the figures) for example.

FIG. 2 is a circuit diagram illustrating a delay control circuit 200 according to an embodiment. The delay control circuit 200 may include an array of parallel delay capacitors ($C_{d1}$-$C_{d7}$) electrically coupled between a first inverter ($INV_1$) and a second inverter ($INV_2$). The delay control circuit 200 may be electrically coupled to a SAR control circuit 30 (as shown in FIG. 1).

The first inverter ($INV_1$) may receive an asynchronous clock (ACLK) (e.g., from the AND logic gate (AND) as shown in FIG. 1). The second inverter ($INV_2$) may output a delayed asynchronous clock (ACLKd) to the SAR control circuit 30. The delay capacitors ($C_{d1}$-$C_{d7}$) are controlled by a delay control word (DL<7:1>) generated by the SAR control circuit 30 to adjust the delayed asynchronous clock (ACLKd). The number of delay capacitors ($C_{d1}$-$C_{d7}$) is not limited to 7, and can any integers equal to or greater than 3 for example. The delay capacitors ($C_{d1}$-$C_{d7}$) can be binary-weighted capacitors.

The delay control circuit 200 may further include an array of parallel delay switches ($DL_1$-$DL_7$) respectively connected in series with the array of the parallel delay capacitors ($C_{d1}$-$C_{d7}$). The delay capacitors ($C_{d1}$-$C_{d7}$) can be controlled by the delay control word (DL<7:1>) via the delay switches ($DL_1$-$DL_7$) to adjust the delayed asynchronous clock (ACLKd). FIG. 2 shows that the number of delay switches ($DL_1$-$DL_7$) is 7 for example. The number of delay switches ($DL_1$-$DL_7$) is not limited to 7, and can any integers equal to or greater than 3 for example.

For example, the delay control circuit 200 may receive an asynchronous clock (ACLK) (e.g., from a AND logic gate as shown in FIG. 1) and a digital delay control word (DL<7:1>) generated by the SAR control circuit 30, and create the delayed asynchronous clock (ACLKd) with a delay time ($T_D$) to send to the SAR control circuit 30.

At a calibration mode, the delay control circuit 200 can determine a maximum time delay (Td_max) to the asynchronous clock (ACLK) within a single conversion phase of a sampling clock (CKsample of FIG. 3) as explained below.

At the calibration mode, the delay control circuit 200 is configured to initially delay the asynchronous clock (ACLK) by a delay time ($T_D$) with an initial delay value ($T_{D0}$). For example, the initial delay value ($T_{D0}$) can be set minimum (e.g., $T_{D0}$=0), by setting DL<1>=0, DL<2>=0, DL<3>=0, DL<4>=0, DL<5>=0, DL<6>=0, DL<7>=0.

After that, at the calibration mode, while entire bits (B<9:1>) of the ADC circuit is converted in a single conversion phase, the delay control circuit 200 is configured to repeatedly delaying the asynchronous clock (ACLK) by a delay time ($T_D$), which is increased each time with an additional delay time ΔT (e.g., ΔT=10 ps). That is, each time, the current delay time $T_D$=the previous delay time $T_D$+ΔT. This process of delaying the asynchronous clock (ACLK) repeats on and on in order to determine the maximum time delay (Td_max) to the asynchronous clock (ACLK).

For example, for the second cycle, the delay time ($T_D$) can be increased from 0 to 1 by setting DL<1>=1, DL<2>=0, DL<3>=0, DL<4>=0, DL<5>=0, DL<6>=0, DL<7>=0. For the third cycle, the delay time ($T_D$) can be further increased from 1 to 2 by setting DL<1>=0, DL<2>=1, DL<3>=0, DL<4>=0, DL<5>=0, DL<6>=0, DL<7>=0. For the fourth cycle, the delay time ($T_D$) can be increased from 2 to 3 by setting DL<1>=1, DL<2>=1, DL<3>=0, DL<4>=0, DL<5>=0, DL<6>=0, DL<7>=0, and so on. The increase of the delay time ($T_D$) can be realized using a digital counter by adding 1 for each conversion phase.

At the end, at the calibration mode, responsive to a rising edge of the ready signal (as shown in FIG. 1) of a last bit of the ADC circuit being lag after a rising edge of a trigger signal (trig, as shown in FIG. 3), the delay control circuit 20 is configured to stop calibrating the ADC 100 to determine the maximum time delay (Td_max, such as 1100100) to the asynchronous clock (ACLK). The value of the delay control word (DL<7:1>) corresponding the maximum time delay (Td_max) is save into a register in the SAR control circuit 30 for example.

The value of the delay control word (DL<7:1>) corresponding the maximum time delay (Td_max) that has been saved in the register of the SAR control circuit 30 can be used to create the delayed asynchronous comparator clock (CKcmp) to control the comparator (COMP). In this way, with the delayed comparator clock (CKcmp), the delay control circuit 200 may ensure that the voltage (Vcmp) of the array of the bit capacitors ($C_1$-$C_9$) of the SAR ADC 100 have sufficient settle time, and thus may result in an improved conversion linearity and a reduced power consumption.

Figure 3A:
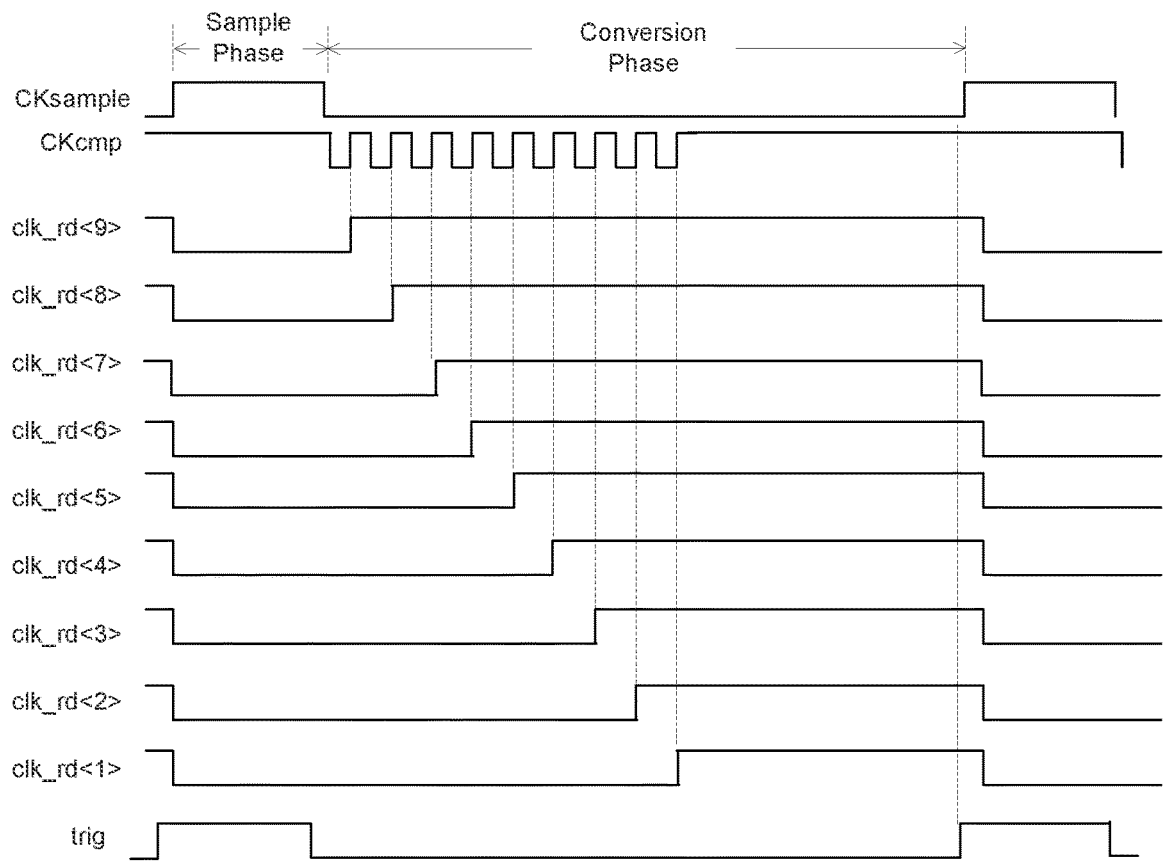
FIG. 3(a)-FIG. 3(c) are clock timing charts illustrating clock timings according to an embodiment.
Figure 3B:
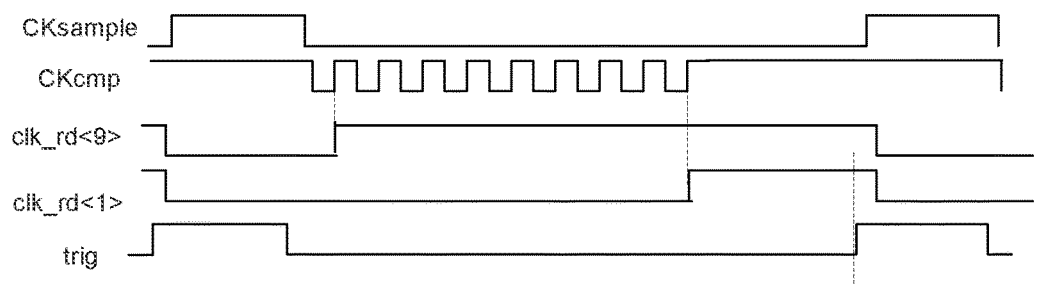
Figure 3C:
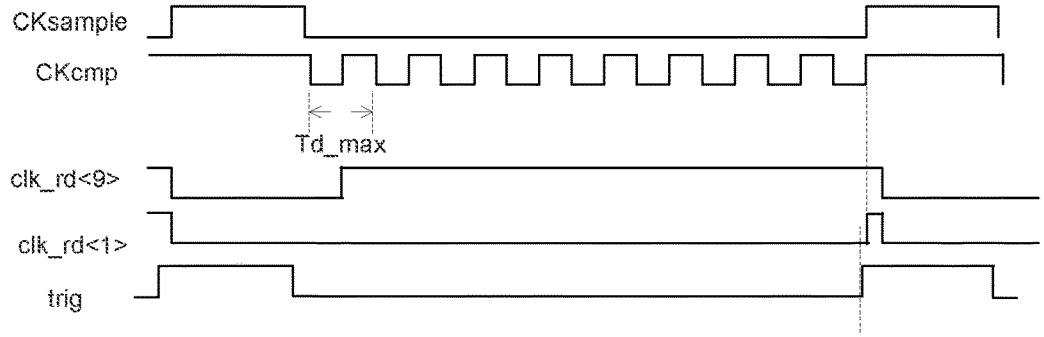

FIG. 3(a)-FIG. 3(c) are clock timing charts illustrating the clock timings of the signals during calibration according to an embodiment.

In FIG. 3(a) and FIG. 3(b), the clk_rd<9:1> can be a latch signal for each bit of the SAR ADC circuit 100, using the least bit latch signal clk_rd<1> to determine the conversion speed. The trig signal is an indicator signal to stop calibrating. For example, if the rising edge of clk_rd<1> is lead before the rising edge of the trig signal, the digital value (such as DL<7:1>) of the array of the delay capacitors of the delay control circuit 200 will be increased by 1 before the next conversion phase, and thus resulting in an increased loop delay. If the rising edge of clk_rd<1> is lag after the rising edge of the trig signal, the calibration is completed or done with a maximum time delay (Td_max) (e.g., 100 ps).

FIG. 3(c) shows a completed mode of the calibration. The digital value (DL<7:1>) of the array of the delay capacitors ($C_1$-$C_6$) will no longer increase and loop delay is stabilized and stopped. Thus, the maximum time delay (Td_max) (e.g., 100 ps) can be determined, and the digital value of the delay control word DL<7:1> can be saved in a register of the SAR control circuit 30.

Figure 4:
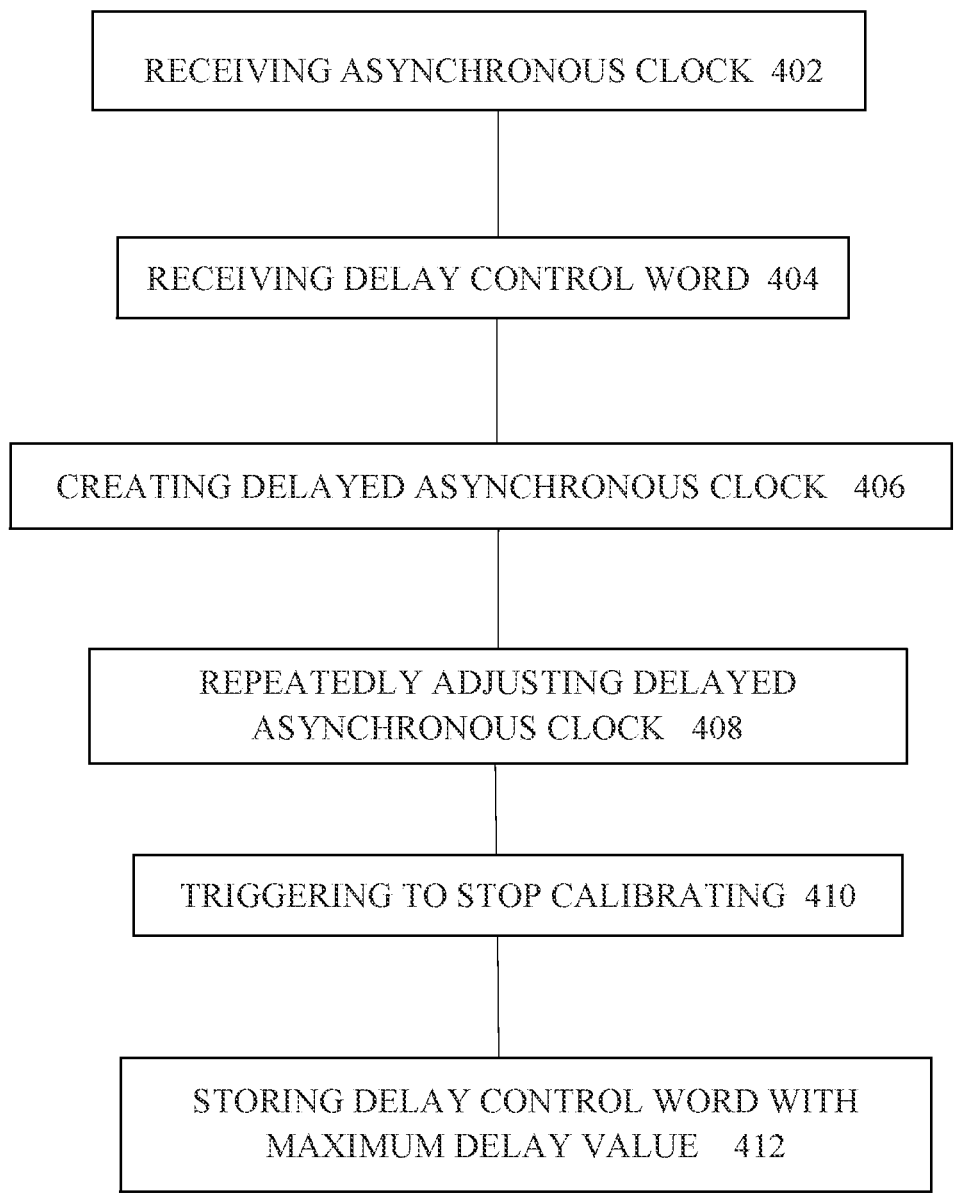
FIG. 4 is a flow chart illustrating a method of calibrating a SAR ADC circuit according to an embodiment.

FIG. 4 is a flow chart illustrating a method 400 of calibrating a SAR ADC circuit 100 using a delay control circuit 200 according to an embodiment. As shown in FIG. 1 and FIG. 2, the delay control circuit 200 may comprise an array of parallel delay capacitors ($C_{d1}$-$C_{d7}$), electrically coupled between a first inverter ($INV_1$) and a second inverter ($INV_2$), and electrically coupled to a SAR control circuit 30 of the SAR ADC circuit 100.

The first inverter ($INV_1$) is configured to receive an asynchronous clock (ACLK) from an AND logic gate (AND). The second inverter ($INV_2$) is configured to output a delayed asynchronous clock (ACLKd) generated by the delay control circuit 200 to the SAR control circuit 30. The delay capacitors ($C_{d1}$-$C_{d7}$) are controlled by a delay control word (DL<7:1>) generated by the SAR control circuit 30 to adjust the delayed asynchronous clock (ACLKd).

The method 400 of calibrating the SAR ADC circuit 100 using the delay control circuit 200 is described as follows.

In block 402, receiving the asynchronous clock (ACLK) by the first inverter ($INV_1$) of the delay control circuit 200 at the beginning of the calibration.

In block 404, receiving the delay control word (DL<7:1>) from the SAR control circuit 30 by the delay control circuit 200 at the beginning of the calibration.

In block 406, creating the delayed asynchronous clock (ACLKd) based on the asynchronous clock (ACLK) and the delay control word (DL<7:1>) by the delay control circuit 200. The delayed asynchronous clock (ACLKd) is generated by the delay control circuit 200 and is transmitted to the SAR control circuit 30.

In block 408, repeatedly adjusting the delayed asynchronous clock (ACLKd) by adjusting the delay capacitors ($C_{d1}$-$C_{d7}$) of the delay control circuit 200 to find a maximum delay value (Td_max) for the delayed asynchronous clock (ACLKd).

In block 410, triggering to stop calibrating the SAR ADC circuit 100 to determine a maximum delay value (Td_max) for the delayed asynchronous clock (ACLKd).

In block 412, storing the value of the delay control word (DL<7:1>) corresponding the maximum time delay (Td_max) for the delayed asynchronous clock (ACLKd) in the SAR control circuit 30.

The value of the delay control word (DL<7:1>) corresponding the maximum time delay (Td_max) saved in the register of the SAR control circuit 30 can be used to create the delayed asynchronous comparator clock (CKcmp) to control the comparator (COMP). In this way, with the delayed comparator clock (CKcmp), the delay control circuit 200 may ensure that the voltage (Vcmp) of the array of the bit capacitors ($C_1$-$C_9$) of the SAR ADC 100 have sufficient settle time, and thus may result in an improved conversion linearity and a reduced power consumption.

Features and aspects of various embodiments may be integrated into other embodiments, and embodiments illustrated in this document may be implemented without all of the features or aspects illustrated or described.

One skilled in the art will appreciate that although specific examples and embodiments of the system and methods have been described for purposes of illustration, various modifications can be made without deviating from the spirit and scope of the present application. Moreover, features of one embodiment may be incorporated into other embodiments, even where those features are not described together in a single embodiment within the present document. Accordingly, the application is described by the appended claims.

What is claimed is:

1. An Analog-Digital Convertor (ADC) circuit comprising:
    an array of bit capacitors ($C_1$-$C_9$) parallelly connected between a sampling switch ($SW_1$) and an array of bit switches ($B_1$-$B_9$);
    a comparator (COMP) comprising an input voltage end ($V_{CMP}$) electrically connected to the sampling switch, a reference voltage end ($V_{REF}$), and a first and a second output ends ($D_{CMPp}$, $D_{CMPn}$);
    a NOR gate electrically connected to the first and the second output ends of the comparator;
    an AND gate configured to create an asynchronous clock (ACLK) based on a synchronous clock (CLKin) and a first digital output ($D_1$) as a ready signal from the NOR gate;
    a delay control circuit (20) configured to receive the asynchronous clock from the AND gate and to create a delayed asynchronous clock (ACLKd); and
    a Successive-Approximation Register (SAR) control circuit (30) configured to receive a second digital output ($D_2$) from the comparator, receive the delayed asynchronous clock from the delay control circuit, transmit a bit control signal (B<9:1>) to the bit capacitors, and transmit a delay control word (DL<7:1>) to the delay control circuit, wherein the delay control circuit is configured to create an asynchronous comparator clock (CKcmp) to control the comparator.

2. The ADC circuit of claim 1, wherein the bit switches are parallelly connected the bit capacitors and a bias circuit respectively.

3. The ADC circuit of claim 1, wherein the SAR control circuit is configured to output a digital converter out (ADC_Dout<9:1>) at a conversion mode.

4. The ADC circuit of claim 1, wherein the delay control circuit comprises an array of parallel delay capacitors ($C_{d1}$-$C_{d7}$) coupled between a first inverter ($INV_1$) and a second inverter ($INV_2$), and wherein the delay capacitors are controlled by the delay control word generated by the SAR control circuit.

5. The ADC circuit of claim 4, wherein the array of the parallel delay capacitors of the delay circuit are respectively connected in series with an array of parallel delay switches ($DL_1$-$DL_7$).

6. The ADC circuit of claim 4, wherein the delay control circuit is configured to delay the asynchronous clock to create the delayed asynchronous clock, and output the delayed asynchronous clock to the SAR control circuit.

7. The ADC circuit of claim 1, wherein at a calibration mode, the delay control circuit is configured to initially delay the asynchronous clock (ACLK) by an initial delay time with a minimum control value (DL<7:0>=0x0).

8. The ADC circuit of claim 7, wherein at the calibration mode, the delay control circuit is configured to keep delaying the asynchronous clock by repeatedly increasing delay time with an additional delay time ΔT each time where entire bits (B<9:1>) of the ADC circuit is converted in a single conversion phase.

9. The ADC circuit of claim 8, wherein at the calibration mode, responsive to a rising edge of the ready signal of a last bit of the ADC circuit being lag after a rising edge of a trigger signal (trig), the delay control circuit is configured to complete the calibration mode, and save the value of the delay control word with a maximum time delay into a register in the SAR control circuit.

10. The ADC circuit of claim 1, wherein the delay control circuit is configured to create the asynchronous comparator clock based on a value of the delay control word with a maximum time delay to control the comparator.

11. A delay control circuit comprising:
an array of parallel delay capacitors ($C_{d1}$-$C_{d7}$) coupled between a first inverter ($INV_1$) and a second inverter ($INV_2$), and coupled to a Successive-Approximation Register (SAR) control circuit,
wherein the first inverter is configured to receive an asynchronous clock (ACLK), wherein the second inverter is configured to output a delayed asynchronous clock (ACLKd) to the SAR control circuit, and wherein the delay capacitors are controlled by a delay control word (DL<7:1>) generated by the SAR control circuit to adjust the delayed asynchronous clock, wherein at a calibration mode, the delay control circuit is configured to initially delay the asynchronous clock by a delay time ($T_D$) with an initial delay value ($T_{D0}$), and wherein the initial value of the control word is set minimum (DL<7:0>=0x0), and wherein at the calibration mode, the delay control circuit is configured to keep delaying the asynchronous clock by repeatedly increasing the delay time ($T_D$) each time with an additional delay time (ΔT) where entire bits (B<9:1>) of the ADC circuit is converted in a single conversion phase.

12. The delay control circuit of claim 11, wherein the delay control circuit further comprises an array of parallel delay switches ($DL_1$-$DL_7$) respectively connected in series with the array of the delay capacitors, and wherein the delay capacitors are controlled by the delay control word via the delay switches.

13. The delay control circuit of claim 11, wherein at the calibration mode, responsive to a rising edge of the ready signal of a last bit of the ADC circuit being lag after a rising edge of a trigger signal (trig), the delay control circuit is configured to complete the calibration mode, and save the value of the delay control word with a maximum time delay into a register in the SAR control circuit.

14. The delay control circuit of claim 13, wherein the SAR control circuit is configured to create an asynchronous comparator clock (CKcmp) based on the value of the delay control word with the maximum time delay.

15. A method of calibrating an a Successive-Approximation Register (SAR) Analog-Digital Convertor (ADC) circuit using a delay control circuit,
the delay control circuit comprising an array of parallel delay capacitors coupled between a first inverter and a second inverter, and being coupled to a SAR control circuit, wherein the first inverter is configured to receive an asynchronous clock and the second inverter is configured to transmit a delayed asynchronous clock to the SAR control circuit, and wherein the delay capacitors are controlled by a delay control word generated by the SAR control circuit to adjust the delayed asynchronous clock;
the method comprising:
receiving the asynchronous clock by the delay control circuit;
receiving the delay control word from the SAR control circuit by the delay control circuit;
creating the delayed asynchronous clock based on the asynchronous clock and the delay control word by the delay control circuit to transmit to the SAR control circuit;
repeatedly adjusting the delayed asynchronous clock by adjusting the delay capacitors;
triggering to stop calibrating the ADC circuit to determine a maximum delay value for the delayed asynchronous clock; and
storing the delay control word corresponding the maximum delay value in the SAR control circuit.

16. The method of claim 15, wherein at a calibration mode, the delay control circuit is configured to initially delay the asynchronous clock by a delay time with an initial delay value, and wherein the initial value of control word is set minimum.

17. The method of claim 16, wherein the delay control circuit is configured to keep delaying the asynchronous clock by repeatedly increasing the delay time each time with an additional delay time where entire bits of the ADC circuit is converted in a single conversion phase.

18. The method of claim 17, wherein responsive to a rising edge of a ready signal of a last bit of the ADC circuit being lag after a rising edge of a trigger signal, the delay control circuit is configured to stop calibrating the ADC circuit.

* * * * *